United States Patent [19]
Kim

[11] Patent Number: 5,219,704
[45] Date of Patent: Jun. 15, 1993

[54] PROCESS FOR IMPROVING PHOTO SENSITIVE MATERIAL OF POLYVINYLPYRROLIDONE TYPE

[75] Inventor: Youngdae Kim, Pusan, Rep. of Korea

[73] Assignee: Samsung Electron Devices Co., Ltd., Rep. of Korea

[21] Appl. No.: 811,823

[22] Filed: Dec. 20, 1991

[30] Foreign Application Priority Data

Dec. 21, 1990 [KR] Rep. of Korea .................. 90-21540

[51] Int. Cl.$^5$ .......................... G03C 1/72; G03C 5/00
[52] U.S. Cl. ....................................... 430/270; 430/28
[58] Field of Search ................... 430/28, 270, 281, 25, 430/29, 287, 26, 283

[56] References Cited

U.S. PATENT DOCUMENTS 4,273,842  6/1981  Nonogaki et al. .................... 430/25
4,735,880  4/1988  Morishita et al. .................... 430/28

FOREIGN PATENT DOCUMENTS 63-72029  4/1988  Japan .

*Primary Examiner*—Marion E. McCamish
*Assistant Examiner*—Rosemary Ashton
*Attorney, Agent, or Firm*—Christie, Parker & Hale

[57] ABSTRACT

Described is a process for improving a photo sensitive material of polyvinylpyrrolidone type by improving its chemical and ability to maintain a straight line property even after etching. The present invention proposes such that at least one of a nitrate, a sulfate or a hydrochloride of two or three valanced metal ions is added to polyvinylpyrrolidone in the ratio of 0.01 to 10% and then well stirred with the appropriate amount of an aqueous ammonia at the normal or room temperatures to obtain a pH of 7 to 10 thereby producing a metal hydroxide.

2 Claims, 1 Drawing Sheet

PROCESS FOR IMPROVING PHOTO SENSITIVE MATERIAL OF POLYVINYLPYRROLIDONE TYPE

FIELD OF THE INVENTION

The present invention relates to a process for improving a photo sensitive material of a polyvinylpyrrolidone type, and in particular to a process for improving a photo sensitive material of a polyvinylpyrrolidone type to increase the straight line property of a black matrix formed on a fluorescent layer of color cathode ray tubes.

BACKGROUND OF THE INVENTION

Conventionally, color cathode ray tubes are formed such that a face plate on which phosphors are coated and a shadow mask is mounted is connected to a funnel to form a bulb. An electron gun is inserted, exhausted and sealed in the neck of the bulb. The phosphors coated on the face plate thereof are formed in a series of patterns each having Red, Green, Blue(R,G,B). Electron beams emitted from the electron gun pass through the shadow mask and impact the phosphors thereby forming spots on a screen. However, whereas a plan for the color cathode ray tube is that the R.G.B. electron beams should each strike the corresponding R.G.B. phosphors, in practice some electron beams strike other neighbouring phosphors thereby causing mixed colors. To prevent such problem, a black matrix is formed among the R.G.B. phosphors, so that some electron beams do not misland on the neighbouring phosphors.

This black matrix is formed by a well-known photolithography. A photo sensitive material is deposited on the inner surface of the face plate. A prepared mask for black matrix is placed thereon, exposed to the light and then developed, thereby forming photo sensitive material stripes. On the remaining space formed therebetween is deposited the black matrix composition and then these stripes ar dissolved and removed by an etching solution thereby forming black matrix stripes.

However, these black matrix stripes should be in a straight line, and this depends wholly upon the straight line property of photo sensitive material during the photolithography process.

A method of obtaining the photo sensitive material having good straight line property has been studied. Recently, it was discovered that photo sensitive material comprising a polyvinylpyrrolidone as a main element has excellent photo sensitive straight line property by selecting and controlling a photo sensitive region. On the basis of this discovery Japanese Patent Publication (before Examination) No. Sho 63-72029 provides a method of improving the straight line property of the black matrix by adding polyvinylpyrrolidone thereto. However, even though this polyvinylpyrrolidone photo sensitive material has the excellent straight line property when exposed to light, it makes poor use of such property at the etching process.

To etch the polyvinylpyrrolidone type photo sensitive material after exposure to light, hydrogen peroxide water, a dilute sulfuric acid solution or a sulfamic acid solution is used as the etching solution. However, since the chemical property of polyvinylpyrrolidone is very stable, it has the disadvantage of remaining as a residue even after etching and attaching phosphors to this residue when depositing the phosphors thereby causes the mixed colors.

SUMMARY OF THE INVENTION

Accordingly, a feature of the present invention is a process for improving a photo sensitive material of a polyvinylpyrrolidone-type to improve the chemical property thereof so as to maintain a straight line property even after etching.

To obtain this feature, the present invention proposes that at least one of a nitrate, a sulfate or a hydrochloride of two or three valanced metal ions be added to a polyvinylpyrrolidone in the ratio of 0.01 to 10% and then well stirred with ammonia water to achieve a pH of 7 to 10, thereby producing a metal hydroxide.

BRIEF DESCRIPTION OF THE DRAWINGS

Further features and advantages of the present invention will be apparent in the following detailed description in connection with the accompanying drawings, in which.

DETAILED DESCRIPTION OF THE PREFERRED EMBODIMENT

Figure 1A:
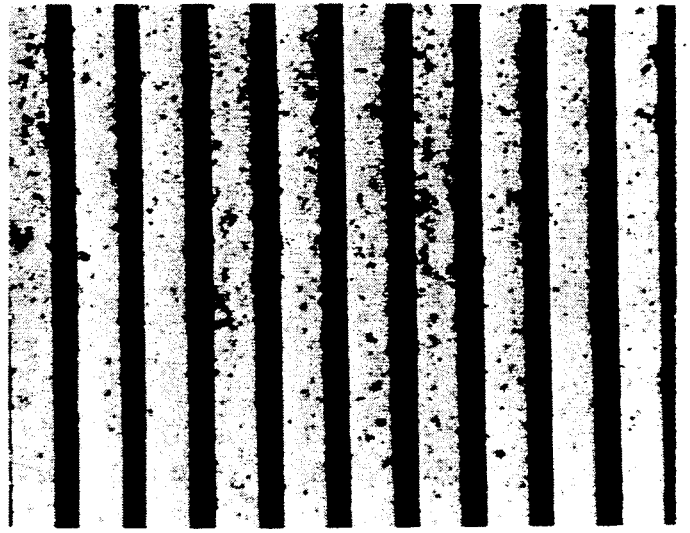
FIG. 1A is a microphotograph ( × 500 ) of a black matrix formed on a fluorescent layer of color cathode ray tubes using an improved photo sensitive material of a polyvinylpyrrolidone type of the present invention.

At least one of a nitrate, a sulfate or a hydrochloride of two or three valanced metal ions is added to a polyvinylpyrrolidone in the ratio of 0.01 to 10% and then well stirred with the appropriate amount of an ammonia water at the normal temperature, so that a pH 7 to pH 10 is obtained, thereby producing a metal hydroxide. As the two or three valanced metal ions, there are $Zn^{+2}$, $Al^{+3}$, $Ba^{+2}$, $Cd^{+2}$, $Mg^{+2}$ and the like.

The polyvinylpyrrolidone as described above is deposited on the inner surface of a conventional face plate. A mask for black matrix is placed thereon, exposed to the light and then developed by warm water of about 20° to 50° C. thereby forming photo sensitive material stripes. On the remaining space formed therebetween is deposited a graphite solution and then the stripes are etched by using a hydrogen peroxide water, a dilute sulfuric acid solution or sulfamic acid solution as the etching solution. Since this etching solution has a property of oxidizing and decomposing organic compounds, it can oxidize and decompose the organic compounds in the photo sensitive material stripe thereby forming the predetermined black matrix stripes. At that time the solution is rapidly reacted with the metal hydroxide described previously and dissolved, so that the polyvinylpyrrolidone has a good straight line property thereby forming the straight crossing black matrix patterns when being developed. The usual time required for etching is about 30 to 60 sec.

Described below ar examples of the present invention in connection with the preferred embodiments.

EXAMPLE 1

1000 ml of 10 weight percentage aqueous polyvinylpyrrolidone solution with 100 ml aqueous soln. of 0.5 g zinc sulfate solution is stirred for 10 min. Thereafter, an ammonia water is added so that the mixture is maintained at pH 7. 1 g of photo sensitive agent DAS(-Diazonium salt) is added to this mixed solution. And then this mixed solution is deposited on an inner surface of a face plate, exposed to the light, and developed. A graphite solution is deposited thereon and then dried. Thereafter, it is etched by 10 weight percentage of sulfamic acid solution for 30 sec and then washed down by a pure water thereby obtaining the black matrix on a phosphor layer of a color cathode ray tube.

EXAMPLE 2

1000 ml of 10 weight percentage aqueous polyvinylpyrrolidone solution with 100 ml aqueous soln. of 1.5 g zinc sulfate is stirred for 10 min. Thereafter, ammonia water is added so that the mixture is maintained at pH 8. 1 g of photo sensitive agent DAS is added to this mixed solution. And then this mixed solution is deposited on an inner surface of a face plate, exposed to the light, and developed. A graphite solution is deposited thereon and then dried. Thereafter, it is etched by 10 weight percentage of sulfamic acid solution for 30 sec and then washed down by a pure water thereby obtaining the black matrix on a phosphor layer of a color cathode ray tube.

EXAMPLE 3

1000 ml of 10 weight percentage aqueous polyvinylpyrrolidone solution with 100 ml aqueous soln. of 1 g aluminum nitrate is stirred for 10 min. Thereafter, an ammonia water is added so that the mixture is maintained at pH 9. 1 g of photo sensitive agent DAS is added to this mixed solution. And then this mixed solution is deposited on an inner surface of a face plate, exposed to the light, and developed. A graphite solution is deposited thereon and then dried. Thereafter, it is etched by 10 weight percentage of sulfamic acid solution for 30 sec and then washed down by a pure water thereby obtaining the black matrix on a phosphor layer of a color cathode ray tube.

EXAMPLE 4

1000 ml of 10 weight percentage aqueous polyvinylpyrrolidone solution with 100 ml aqueous soln. of 1.5 g zinc nitrate and 0.5 g zinc sulfate is stirred for 10 min. Thereafter, an ammonia water is added so that the mixture is maintained at pH 7.5. 1 g of photo sensitive agent DAS is added to this mixed solution. And then this mixed solution is deposited on an inner surface of a face plate, exposed to the light, and developed. A graphite solution is deposited thereon and then dried. Thereafter, it is etched by 10 weight percentage of sulfamic acid solution for 30 sec and then washed down by a pure water thereby obtaining the black matrix on a phosphor layer of a color cathode ray tube.

EXAMPLE 5

1000 ml of 10 weight percentage aqueous polyvinylpyrrolidone solution with 100 ml aqueous soln. of 2 g barium sulfate is stirred for 10 min. Thereafter, an ammonia water is added so that the mixture is maintained at pH 9. 1 g of photo sensitive agent DAS is added to this mixed solution. And then this mixed solution is deposited on an inner surface of a face plate, exposed to the light, and developed. A graphite solution is deposited thereon and then dried. Thereafter, it is etched by 10 weight percentage of sulfamic acid solution for 30 sec and then washed down by a pure water thereby obtaining the black matrix on a phosphor layer of a color cathode ray tube.

EXAMPLE 6

1000 ml of 10 weight percentage aqueous polyvinylpyrrolidone solution with 100 ml aqueous soln. of 1.2 g cadmium nitrate is stirred for 10 min. Thereafter, an ammonia water is added so that the mixture is maintained at pH 8.5. 1 g of photo sensitive agent DAS is added to this mixed solution. And then this mixed solution is deposited on an inner surface of a face plate, exposed to the light, and developed. A graphite solution is deposited thereon and then dried. Thereafter, it is etched by 10 weight percentage of sulfamic acid solution for 30 sec and then washed down by a pure water thereby obtaining the black matrix on a phosphor layer of a color cathode ray tube.

EXAMPLE 7

1000 ml of 10 weight percentage aqueous polyvinylpyrrolidone solution with 100 ml aqueous soln. of 3 g magnesium chloride is stirred for 10 min. Thereafter, an ammonia water is added so that the mixture is maintained at pH 9. 1 g of photo sensitive agent DAS is added to this mixed solution. And then this mixed solution is deposited on an inner surface of a face plate, exposed to the light, and developed. A graphite solution is deposited thereon and then dried. Thereafter, it is etched by 10 weight percentage of sulfamic acid solution for 30 sec and then washed down by a pure water thereby obtaining the black matrix on a phosphor layer of a color cathode ray tube.

COMPARATIVE EXAMPLE 1

10 weight percentage aqueous polyvinylpyrrolidone solution with 1 g of DAS is sufficiently stirred and then deposited on the inner surface of a face plate, exposed to the light and developed. A graphite solution is deposited and dried. Thereafter, it is etched by 10 weight percentage of sulfamic acid solution for 30 sec and then washed down by a pure water thereby obtaining the black matrix on a phosphor layer of a color cathode ray tube.

Figure 1B:
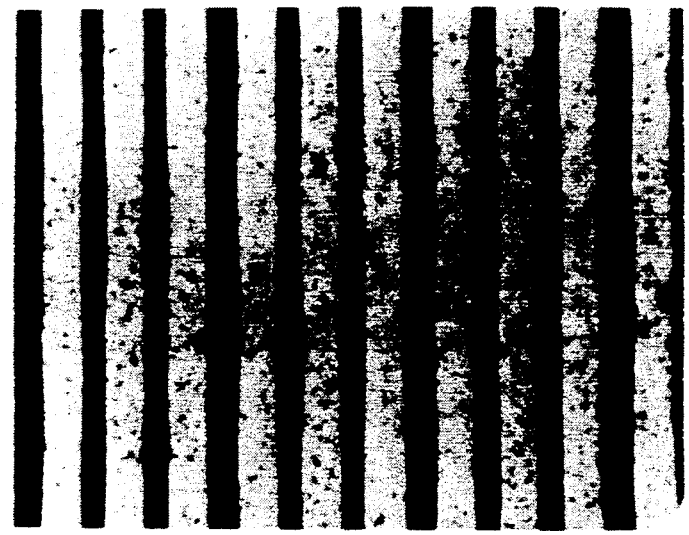
FIG. 1B is a microphotograph ( × 500 ) of a black matrix formed on a fluorescent layer of color cathode ray tubes using an conventional photo sensitive material of a polyvinylpyrrolidone type.

The microphotographs of the black matrix prepared according to the example 1 and the comparative example 1 above show hat while that of the example 1 ( FIG. 1A ) has excellent straight line property, that of the comparative example 1 ( FIG. 1B ) has poor straight line property.

As described above, the present invention improves the quality of polyvinylpyrrolidone photo sensitive material as a metal hydroxide, so that the conventional etching solution can well dissolve a photo sensitive part thereof thereby obtaining the good straight line property when being developed and a good black matrix pattern.

What is claimed is:

1. A process for improving a polyvinylpyrrolidone-based photosensitive material comprising adding at least one nitrate, sulfate or chloride of a metal ion selected from the group consisting of metal ions having two and three positive valences to a polyvinylpyrrolidone in the ratio of 0.01 to 10% and mixing the polyvinylpyrrolidone-containing mixture with ammonia water to obtain a pH of about 7 to 10 to produce a hydroxide of said metal ion.

2. A improvement as claimed in claim 1, wherein said ammonia water is mixed at room temperature.

* * * * *